Nov. 9, 1965 KUO CHEN HU 3,217,268
TUNNEL DIODE SATURABLE CORE MULTIVIBRATOR
Filed July 18, 1961 2 Sheets-Sheet 1
Fig. 1.
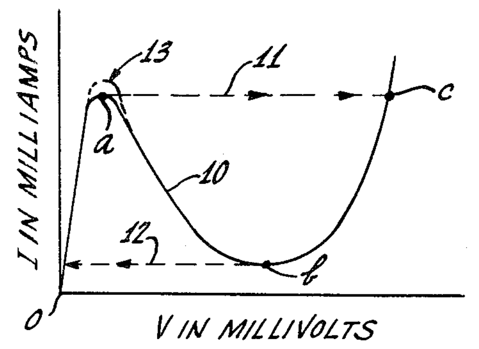
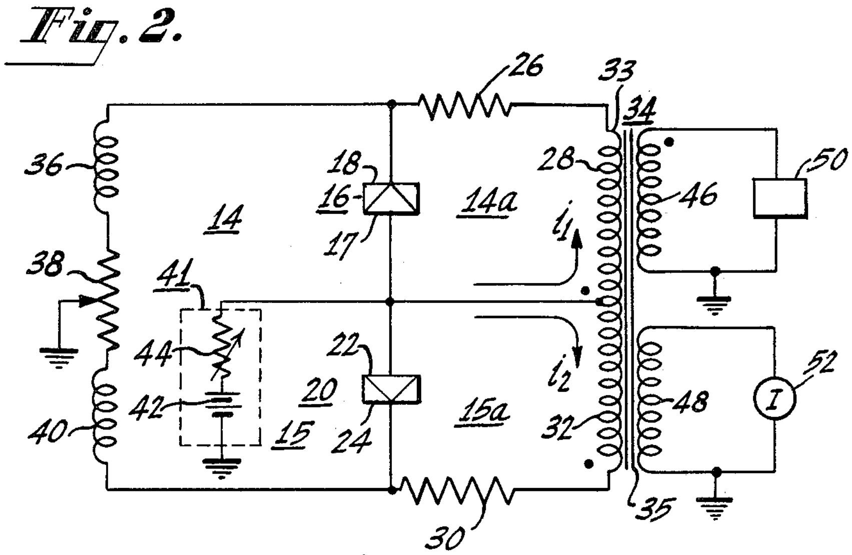
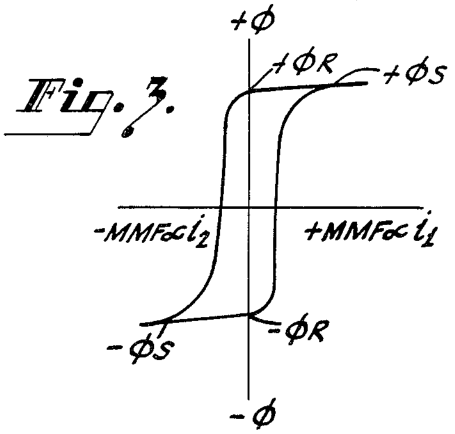
INVENTOR.
KUO CHEN HU
BY Eugene M. Whitacre
ATTORNEY INVENTOR.
KUO CHEN HU
BY Eugene M. Whitacre
ATTORNEY

United States Patent Office 3,217,268
Patented Nov. 9, 1965

3,217,268
TUNNEL DIODE SATURABLE CORE MULTIVIBRATOR

Kuo Chen Hu, Levittown, Pa., assignor to Radio Corporation of America, a corporation of Delaware
Filed July 18, 1961, Ser. No. 124,919
4 Claims. (Cl. 331—107)

This invention relates to multivibrators and more particularly to free-running multivibrators utilizing negative resistance tunnel diodes.

Free-running multivibrators utilizing negative resistance diodes have been heretofore disclosed in the art. One such multivibrator works on the principle that a diode which exhibits a voltage-controlled dynamic negative resistance, such as a tunnel diode, can be switched rapidly from a low voltage state to a high voltage state, and vice versa, by connecting a suitable inductor in series with the diode and energizing the circuit properly. When two such circuits are connected in parallel and magnetically coupled together in phase opposition by means of the inductors, one diode can be made to switch to its high voltage state while the other diode simultaneously switches to its low voltage state and vice versa. Multivibrator action is therefore provided and a substantially square wave output voltage is obtained from the circuit.

The frequency of oscillations of such multivibrators is dependent upon the bias supply voltage, the circuit parameters and the individual tunnel diode characteristics. These frequency determining factors are so nonlinearly inter-related that such multivibrators cannot with ease be designed to operate at a particular given frequency without cut and try methods, nor can they be tuned continously over a range of frequencies. When the bias supply voltage is varied to function as a frequency tuning control, the frequency variation is nonuniform and abrupt discontinuties occur which make the frequency output a double-valued function of supply voltage. Furthermore such multivibrators, when designed to operate at a particular frequency, are subject to frequency drift because slight variations in the bias supply voltage may cause significant changes in the frequency of oscillations.

It is an object of this invention to provide an improved negative resistance diode free-running multivibrator.

It is another object of this invention to provide an improved negative resistance diode free-running multivibrator which will operate stably at selected frequencies which may range from the kilocycle to the megacycle region.

It is another object of this invention to provide an improved negative resistance diode free-running multivibrator which is continously tunable throughout a broad range of frequencies.

A multivibrator in accordance with the invention includes a pair of circuit brances which are conected in parallel across a biasing source. Each circuit branch includes a network comprising a negative resistance diode coupled in parallel with the series combination of a resistor and a nonlinear inductor, and each network is connected in series with an impedance device exhibiting a high A.C. impedance, such as an R.F. choke. The nonlinear inductors comprise windings, such as the windings of a transformer, having a magnetic core which exhibits a substantially rectangular hysteresis loop characteristic. The parallel circuit branches are magnetically coupled together by means of the core and are connected to the biasing source so as to create opposing magnetic fields in the core. The transformer also may include a secondary output winding as well as a frequency control winding.

The negative resistance diodes effectively function as switching devices in the multivibrator circuit. The nonlinear inductors function as control devices causing the diodes to switch alternately between their low and high voltage states. More particularly, in the first circuit branch, the voltage produced across the first nonlinear inductor when the first diode switches from a low to a high voltage state causes the second diode in the second circuit branch, to be clamped to its low voltage state due to the phase reversed voltage induced in the second nonlinear inductor. The first diode being in its high state, causes increased current to flow in the first nonlinear inductor thereby building up the flux in one direction until saturation of the magnetic core occurs. At saturation, the voltage across the first nonlinear inductor is significantly reduced. This causes the first diode to switch back to its low voltage state which tends to decrease the current through the first nonlinear inductor. The decay in current in the first inductor reverses the polarity of the voltages induced in the first and second nonlinear inductors, which causes the second diode to switch to its high voltage state and effectively clamps the first diode in its low voltage state. Whereupon, the cycle repeats itself.

A substantially square wave output voltage may be derived from across the secondary output winding and the frequency of the output wave is dependent upon the time it takes for the magnetic core to saturate. By applying an initial magnetizing current to the magnetic core, such as by means of a D.-C. current through the control winding, the frequency of the output voltage is controlled.

The novel features which are considered characteristic of this invention are set forth with particularly in the appended claims. The invention itself, however, both as to its organization and method of operation as well as additional objects and advantages thereof will best be understood from the following description when read in conjunction with the accompanying drawing in which:

FIGURE 1 is a graph illustrating the current-voltage characteristic of a tunnel diode;

FIGURE 2 is a schematic circuit diagram of a negative resistance diode multivibrator in accordance with the invention;

Figure 4:
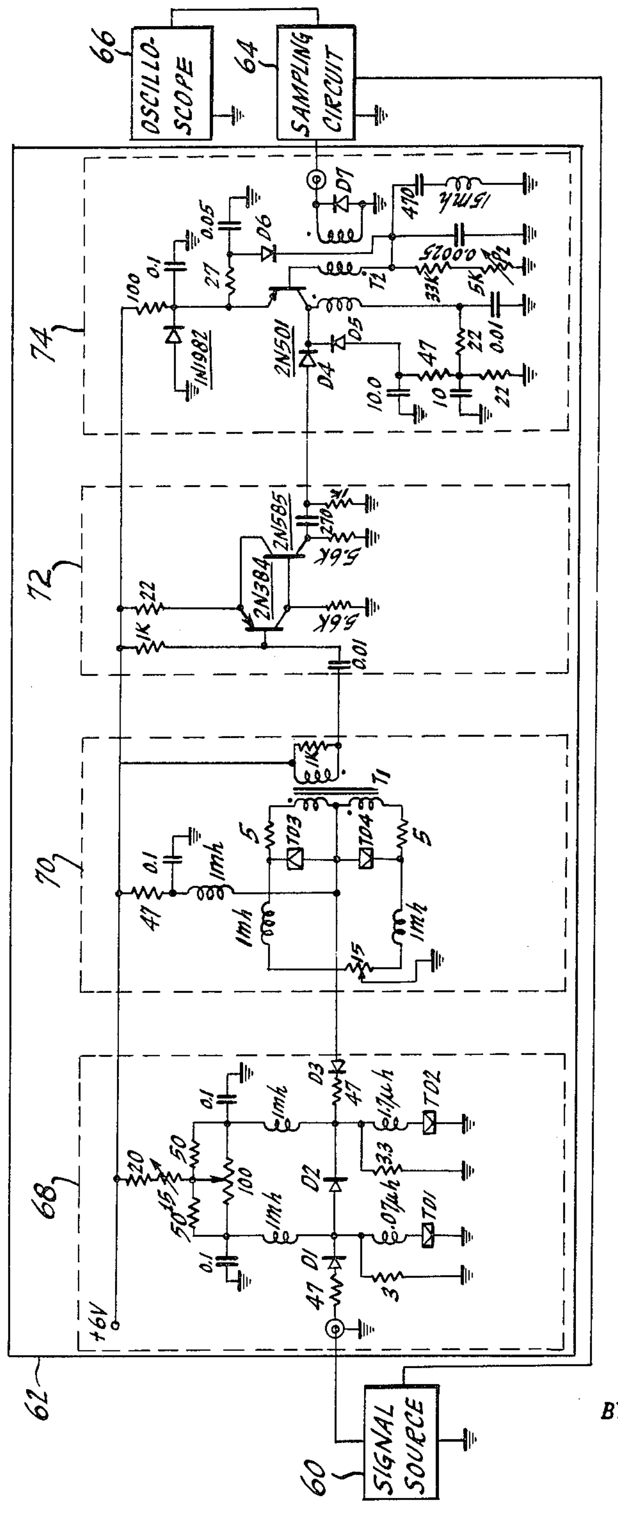

FIGURE 3 is a graph illustrating the hysteresis characteristic of a magnetic core suitable for use in the multivibrator of FIGURE 2 and FIGURE 4 is a schematic circuit diagram, partially in block form, of an auxiliary circuit for connections to a conventional oscilloscope for viewing high frequency repetitive wave forms and which auxiliary circuit includes a multivibrator in accordance with the invention.

In FIGURE 1, the curve 10 is an illustration of a typical current-voltage characteristic of a voltage-controlled negative resistance diode suitable for use in multivibrators embodying the invention. Such a diode has been described by H. S. Sommers in the article "Tunnel Diodes as High Frequency Devices" at page 1201 in the July 1959 issue of the proceedings of the IRE.

In the forward voltage direction, the characteristic curve 10 exhibits three distinct regions. The region *o–a*, at low values of forward voltage, has a positive slope and the diode exhibits a positive dynamic resistance (i.e. the increment $\Delta V/\Delta I$ is positive) when operated in this region. The region *a–b*, at intermediate values of forward voltages, has a negative slope and the diode exhibits a negative resistance throughout this region. The region *b–c* at higher values of forward voltages is a second region of positive resistance. The positive resistance regions *o–a* and *b–c* are regions of stable operation of the diode and correspond respectively to a low voltage state and a hgh voltage state. With a proper choice of circuit parameters, such as a suitable inductor coupled to the diode, the negative resistance region *a–b* becomes a region of unstable operation for the diode. Under such conditions, the diode will not remain in the negative resistance region *a–b* but will instead switch rapidly through this region from the low voltage state to the high voltage state and vice versa. Such switching characteristics are represented in FIGURE 1 by the dotted lines 11 and 12 and are utilized in a multivibrator in accordance with the invention.

A second characteristic curve 13, shown dotted in FIGURE 1, represents the current-voltage characteristics of a second tunnel diode. It is to be noted that this characteristic differs slightly from the characteristic curve 10. Such differences are due primarily to manufacturing tolerances and are made use of in a multivibrator circuit embodying the invention.

Referring to FIGURE 2, a multivibrator in accordance with the invention includes a pair of parallel circuit branches 14 and 15. The circuit branch 14 includes a network 14*a* comprising a negative resistance diode 16, having an anode 17 and a cathode 18, which is connected across the series combination of a resistor 26 and a nonlinear inductor 28. The circuit branch 15 also includes a network 15*a* comprising a substantially identical negative resistance diode 20, having an anode 22 and a cathode 24, which is connected across the series combination of a resistor 30 and a nonlinear inductor 32. The resistors 26 and 30 are selected to be equal and of a relatively small resistance magnitude.

The nonlinear inductors 28 and 32 in combination comprise a center-tapped primary winding 33 of a transformer 34 having a magnetic core 35. The magnetic core 35 is composed of a magnetic material having a substantially rectangular hysteresis loop characteristic, such as that illustrated in FIGURE 3. The inductors 28 and 32 are wound on the magnetic core 34 in the same direction as indicated by the conventional "dot" symbols. However the anodes 17 and 22 of the diodes 16 and 20 respectively are both connected directly to the center tap of the primary winding 33 while the cathodes 18 and 24 are coupled to opposite terminals thereof. Thus the diodes 16 and 20 are connected to oppositely phased terminals of the inductors 28 and 32.

The circuit branch 14 also includes an inductor or radio frequency choke coil 36 which is connected in series between cathode 18 of the diode 16 and one terminal of a potentiometer 38. Similarly the circuit branch 15 includes an R-F choke 40 connected between the cathode 24 of the diode 20 and the other terminal of the potentiometer 38. The adjustable arm of the potentiometer 38 is connected to a point of reference or ground in the circuit. The potentiometer 38 is included to provide a means of balancing the circuit branches 14 and 15.

A biasing source 41 including the series combination of a battery 42 and a variable resistor 44 is connected between ground and the junction of the anodes 17 and 22 of the diodes 16 and 20 to forward bias the diodes.

The transformer 34 also includes a secondary output winding 46 as well as a control winding 48. A load or utilization circuit 50 is connected across the terminals of the secondary winding 46 while a well regulated constant current source 52 is coupled across the control winding 48.

In describing the operation of the circuit of FIGURE 2, it will be assumed that the diode 16 has the characteristic curve 10 in FIGURE 1 and that the diode 20 has the characteristic curve 13. The circuit is energized and the currents through the circuit branches 14 and 15 are increased by adjusting the variable resistor 44 to increase the current. The currents through the diodes 16 and 20 will be approximately equal and increase substantially similarly as shown by the near coincidence of the characteristic curves 10 and 13 in FIGURE 1. The currents $i_1$ and $i_2$ through the nonlinear inductors 28 and 32 respectively will also increase substantially equally. Since the currents $i_1$ and $i_2$ flow through the nonlinear inductors 28 and 32 in opposite directions, substantially no net flux changes will occur in the magnetic core 35 during this initial current increase and no voltages will be induced in any of the windings of the transformer 34.

It is believed that due to the slight dissimilaritly between the characteristic curves 10 and 13, the diode 16 reaches its current peak point, *a* in FIGURE 1, before the diode 20 reaches its corresponding current peak point.

After the diode 16 has reached its current peak point *a*, a further adjustment of the control resistor 44 to increase the total current tends to drive the diode 16 into its negative resistance region. Since the circuit is not stable in the negative resistance region, the diode 16 switches substantially instantaneously to its high voltage state at *c* as illustrated in FIGURE 1. Once the current from the biasing source 41 has been increased to the value needed to drive the diode 16 into the negative resistance region *a–b*, no further increase in current from the biasing source 41 is necessary for subsequent operation.

The higher voltage across the diode 16 also appears across the resistor 26 and inductor 28 and drives an increased current through these elements. Therefore the flux created by the current $i_1$ will no longer be neutralized by that created by the current $i_2$. Consequently voltages will be induced in the inductor 32 and in the secondary winding 46 of the transformer 34.

The voltage induced in the inductor 32 is of a polarity which makes the dotted terminals thereof positive, and hence is in a direction to reverse bias the diode 20 and therefore effectively decreases the voltage across the diode 20 to clamp this diode in its low voltage state.

As mentioned above, the diode 16, in switching to its high voltage state, tends to increase the current $i_1$ through nonlinear inductor 28, and causes flux in the magnetic core 35 to increase in the direction of positive flux saturation ($+\phi$S), as illustrated in FIGURE 3. It will be assumed that the core 35 is initially saturated in the negative direction at the residual level ($-\phi$R). As the current $i_1$ increases, the flux in the core 35 decreases to zero and then increases in the positive direction at a substantially constant rate. Consequently the voltage induced in the secondary output winding of the transformer 34 will be maintained substantially constant while the flux is changing.

When the flux in the core 35 reaches the positive saturation value ($+\phi$S), substantially no further flux changes occur. The voltages induced in the inductor 32 and the secondary winding 46 will therefore abruptly decrease the near zero. At saturation, the only voltage across the diode 16 will be that produced by the current $i_1$ flowing through the resistor 26. Since the magnitude of the resistor 26 is selected to be quite small, there is not sufficient voltage across the diode 16 to maintain it in the high voltage state. The diode 16 will therefore switch back to its low voltage state as illustrated by the line 12 in FIGURE 1.

The diode 16 in returning to the low voltage state causes a decrease in the current $i_1$. The decreasing current in the inductor 28 starts a flux reversal in the core 35 toward the residual positive flux level ($+\phi$R). This small flux change induces voltages in the inductor 32 and secondary winding 46 which cause the dotted terminal thereof to become negative. Thus, the voltage across the inductor 32 is in a direction which increases the forward bias across the diode 20 and thus causes this diode to switch to its high voltage state. The increased voltage across the diode 20, and the series circuit comprising the resistor 30 and inductor 32 produces an increased current $i_2$ which causes the flux in the magnetic core 35 to increase in the opposite direction toward the negative saturation level ($-\phi$S) and the cycle repeats itself.

A substantially square wave output voltage is derived across the terminals of the secondary winding 46. The period of the output voltage is determined by the equation $$T=\frac{N\Delta\phi}{(V_e-V_a)} \quad (1)$$

where $\Delta\phi$ is the flux change in the magnetic core 35 between opposite saturation levels, N is equal to ½ of the number of turns in the primary winding 33

$V_a$ and $V_e$ are the voltages across a tunnel diode in the low and high voltage stages respectively.

The voltages $V_a$ and $V_e$ for a germanium tunnel diode are on the order of 50 millivolts and 450 millivolts respectively. These voltages vary little for different diodes of this type. Therefore there is no problem of matching diodes in the circuit, but almost any pair of stock tunnel diodes of suitable type may be used. Gallium arsenide tunnel diodes of course have different values of voltages at these points but similarly these voltages vary little in different diodes of this type. Thus $V_e$ and $V_a$ are for all practical purposes constants in Equation 1. Since the number of turns in the primary winding is also a constant, the only remaining parameter in Equation 1 which can vary the period of the output wave is the magnitude of the change in flux between the positive and negative saturation levels. Thus the saturation characteristics of the core 35 offer a convenient means of controlling the period and consequently the frequency of the output voltage.

The saturation characteristics of the core 35 of course depend on the magnetic material used for the core and the size of core itself. However for any particular core, the saturation characteristics can be altered by creating an initial flux in the core. The initial flux will reduce the time needed for the core to saturate and thus will control the output frequency. A preferred method of creating the initial flux is by applying the current source 52 in FIGURE 2. The source 52 should be well regulated to maintain a substantially constant current at any particular setting and thereby prevent current fluctuations due to the flux changes in the core 35.

Thus in accordance with the invention, a free-running multivibrator which utilizes the negative resistance region of a tunnel diode is provided, with the frequency of oscillations being primarily determined by the available flux excursion in a saturable magnetic core. The frequency of oscillations may be selected simply and accurately by utilizing Equation 1. The multivibrator will operate stably at the selected frequency even though the biasing supply fluctuates. The multivibrator may additionally be easily and continuously tuned over a broad range of frequencies.

One application of a multivibrator in accordance with the invention which has been found to be particularly useful is in a synchronizing circuit for frequency division. Such an application is shown in FIGURE 4 which is a schematic diagram, partially in block form, of a system for viewing high frequency repetitive waveforms on a conventional oscilloscope. A source of high frequency waveforms 60, which may for example have an output frequency of 1000 megacycles, is coupled to both a synchronizing or countdown circuit 62 as well as a sampling circuit 64. The output of the sampling circuit 64 is applied directly to an oscilloscope 66. Both the sampling circuit 64 and the oscilloscope 66 are conventional or of any suitable type and are therefore shown in block form.

The synchronizing circuit 62 includes a conventional two-stage tunnel diode oscillator 68 which locks to the input signal applied from the signal source 60 and provides a synchronized output signal having a frequency of 10 megacycles. Thus for an input signal frequency of 1000 megacycles, the locked oscillator 68 provides an output signal having a countdown or frequency scaling of 100 to 1. However the conventional two-stage tunnel diode oscillator 68 may be subject to frequency drift and accordingly a multivibrator or square wave oscillator 70, which is constructed in accordance with the invention, is coupled to the two-stage oscillator 68 to provide a stable frequency output as well as a further countdown or frequency scaling. The multivibrator 70 is free-running with the oscillations being synchronized to the input waves. A two-stage transistor amplifier 72 is coupled to the multivibrator 70 to amplify the output thereof and to drive the final stage which is a conventional transistor blocking oscillator 74. The blocking oscillator 74 provides a further frequency scaling and produces output trigger pulses, at a frequency of 50 kilocycles, which are synchronized to the input signal from the source 60.

The output pulses of the blocking oscillator 74 are applied to the sampling circuit 64 to provide gating pulses which actuate the sampling circuit 64 every 20 microseconds to sample the portion of the input signal which appears at the terminals of the sampling circuit 64 coincident in time with each gating pulse. The sampled portions of the input signal from the sampling circuit 64 are displayed on the screen of the oscilloscope 66 in the form of a series of dots which produce a nearly continuous waveform that is a faithful replica of the input signal from the source 60.

Representative values of the circuit components included in a synchronizing attachment, having a frequency scaling as described above, are shown in FIGURE 4. Components not listed in FIGURE 4 are:

TD1, TD2—50 ma. (Ia) Tunnel diode

TD3, TD4—25 ma. (Ia) Tunnel diode $T_1$—annular Mo-Permalloy tape core ⅛ millinch thick, 1/32 inch wide and ⅛ inch in diameter having a flux capacity of approximately 10 maxwells and having an 8 turn center-tapped primary winding and a 10 turn secondary winding.

$T_2$—ferramic "Q" core F625 each winding 4 turns, bifilar wound.

Thus a synchronizing circuit incorporating a multivibrator constructed in accordance with the invention greatly extends the useful operating range of conventional oscilloscopes and permits operation up to the kilomegacycle region.

What is claimed is:

1. An electrical circuit comprising in combination, first and second parallel circuit branches, including first and second negative resistance tunnel diodes respectively, means magnetically coupling together said circuit branches including first and second nonlinear inductors connected in parallel with said first and second tunnel diodes respectively, said inductors exhibiting a substantially rectangular hysteresis loop characteristic, a first inductance device coupled in series with one terminal of the parallel combination of said first diode and said first inductor, a second inductance device coupled in series with one terminal of the parallel combination of said second diode and said second inductor, and means including a biasing source coupled between the other terminals of said inductance devices and the other terminals of said parallel first and second diode inductor combinations for energizing said parallel circuit branches for operation as a multivibrator.

2. An electrical circuit comprising in combination a pair of parallel circuit branches including respectively, a negative resistance tunnel diode, a nonlinear inductor coupled in parallel with said diode and exhibiting a substantially rectangular hysteresis lop characteristic, and an impedance device coupled in series with the parallel combination of said diode and said inductor, said inductors magnetically coupling together said circuit branches in a manner to cause said diodes to switch alternately and oppositely during operation from a low voltage state to a high voltage state and vice versa, and means including a biasing source coupled across each of said circuit branches for forward biasing said diodes to operate about their negative resistance regions.

3. A multivibrator comprising in combination, a transformer having a substantially rectangular hysteresis loop characteristic and including a center-tapped primary winding and a secondary winding, means adapting said secondary winding for connection to a load, first and second negative resistance tunnel diodes each having an anode and a cathode, means connecting the anodes of said diodes to the center tap of said primary winding, a first resistor connected between the cathode of said first diode and one terminal of said primary winding, a second resistor connected between the cathode of said second diode and the other terminal of said primary winding, first and second choke coils each connected between the cathodes of said diodes and a point of reference potential and means including a biasing source connected between the anodes of said diodes and said point of reference potential for forward biasing said diodes to operate about their negative resistance regions.

4. A square wave oscillator comprising in combination a transformer having a substantially rectangular hysteresis loop characteristic and including a center-tapped primary winding, a secondary output winding and a tertiary winding, means adapting said secondary winding for connection to a load, adapting said tertiary winding for connection to a current source to control the hysteresis loop of said transformer, first and second negative resistance diodes each having an anode and a cathode electrode, means connecting like electrodes of said diodes to the center tap of said primary winding, first and second resistive means each connecting the other electrode of one of said diodes to one terminal of said primary winding, first and second choke coils each connected between said other electrode of said diodes and a point of reference potential, and means connecting an energizing source between the junction of said like electrodes of said diodes and said point of reference potential to forward bias said diodes to operate about their negative resistance regions.

References Cited by the Examiner

UNITED STATES PATENTS

| | | | |
|---|---|---|---|
| 2,991,414 | 7/61 | Tillman | 331—113.1 X |
| 3,070,708 | 12/62 | Dill | 307—88.5 X |
| 3,106,649 | 10/63 | Johnston | 307—88.5 |

OTHER REFERENCES

Myers, A. S., Jr., Esaki Diode Binary Trigger, IBM Technical Disclosure Bulletin, vol. 3, No. 9, pages 32–33, February 1961.

ROY LAKE, *Primary Examiner.*

ARTHUS GAUSS, JOHN KOMINSKI, *Examiners.*